United States Patent
Yang et al.

(10) Patent No.: US 12,034,451 B2
(45) Date of Patent: Jul. 9, 2024

(54) SUCCESSIVE APPROXIMATION REGISTER ANALOG TO DIGITAL CONVERTER DEVICE AND SIGNAL CONVERSION METHOD

(71) Applicant: REALTEK SEMICONDUCTOR CORPORATION, Hsinchu (TW)

(72) Inventors: Jun Yang, Suzhou (CN); Shih-Hsiung Huang, Hsinchu (TW); Yen-Ting Wu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 174 days.

(21) Appl. No.: 17/870,958

(22) Filed: Jul. 22, 2022

(65) Prior Publication Data
US 2023/0116785 A1    Apr. 13, 2023

(30) Foreign Application Priority Data
Oct. 13, 2021    (CN) .......................... 202111191315.5

(51) Int. Cl.
*H03M 1/34*    (2006.01)
*H03M 1/12*    (2006.01)
*H03M 1/46*    (2006.01)

(52) U.S. Cl.
CPC ......... *H03M 1/462* (2013.01); *H03M 1/1245* (2013.01)

(58) Field of Classification Search
CPC .............................. H03M 1/462; H03M 1/1245
USPC ................................. 341/144, 155, 163, 143
See application file for complete search history.

(56) References Cited

U.S. PATENT DOCUMENTS

| | | | |
|---|---|---|---|
| 11,711,089 B2* | 7/2023 | Sharma ............... | H03M 1/0675 341/118 |
| 2012/0112938 A1* | 5/2012 | Haneda ............... | H03M 1/1019 341/110 |
| 2023/0024276 A1* | 1/2023 | Lin ....................... | H03M 3/468 |

OTHER PUBLICATIONS

M. Hesener, T. Eicher, A. Hanneberg, D. Herbison, F. Kuttner and H. Wenske, "A 14b 40MS/s Redundant SAR ADC with 480MHz Clock in 0.13pm CMOS," 2007 IEEE International Solid-State Circuits Conference. Digest of Technical Papers, 2007, pp. 248-600, doi: 10.1109/ISSCC.2007.373387.

(Continued)

*Primary Examiner* — Peguy Jean Pierre
(74) *Attorney, Agent, or Firm* — WPAT, P.C (57) ABSTRACT

A successive approximation register analog to digital converter device includes first and second digital to analog converter (DAC) circuits, a comparator circuit, a controller circuit, and a dynamic element matching (DEM) circuit. The first and second DAC circuits samples an input signal. The comparator circuit and the controller circuit generate first and second bits according to outputs of the first and second DAC circuits. The DEM circuit encodes the first bits to generate third bits, in order to refresh the first DAC circuit. After the first DAC circuit is refreshed, the controller circuit resets partial bits in the second bits. After the partial bits are reset, the comparator circuit generates comparison results according to outputs of the first and second DAC circuits. The controller circuit generates fourth bits according to the comparison results, and generates a digital output according to the first, second, and fourth bits.

20 Claims, 3 Drawing Sheets

(56) References Cited

OTHER PUBLICATIONS

Y. Shu, L. Kuo and T. Lo, "27.2 an oversampling SAR ADC with DAC mismatch error shaping achieving 105dB SFDR and 101dB SNDR over 1kHz BW in 55nm CMOS," 2016 IEEE International Solid-State Circuits Conference (ISSCC), 2016, pp. 458-459, doi: 10.1109/ISSCC.2016.7418105.

T. Hung, J. Wang and T. Kuo, "16.4 A Calibration-Free 71.7dB SNDR 100MS/s 0.7mW Weighted-Averaging Correlated Level Shifting Pipelined SAR ADC with Speed-Enhancement Scheme," 2020 IEEE International Solid- State Circuits Conference—(ISSCC), 2020, pp. 256-258, doi: 10.1109/ISSCC19947.2020.9063055.

T. Hung and T. Kuo, "A 75.3-dB SNDR 24-MS/s Ring Amplifier-Based Pipelined ADC Using Averaging Correlated Level Shifting and Reference Swapping for Reducing Errors From Finite Opamp Gain and Capacitor Mismatch," in IEEE Journal of Solid-State Circuits, vol. 54, No. 5, pp. 1425-1435, May 2019, doi: 10.1109/JSSC.2019.2891650.

\* cited by examiner

SUCCESSIVE APPROXIMATION REGISTER ANALOG TO DIGITAL CONVERTER DEVICE AND SIGNAL CONVERSION METHOD

BACKGROUND OF THE INVENTION

1. Field of the Invention

The present disclosure relates to an analog to digital converter, especially to a successive approximation register analog to digital converter device that utilizes a dynamic element matching technique and statistical calculation and a signal conversion method thereof.

2. Description of Related Art

In a successive approximation register analog to digital converter, a capacitance value of each capacitor in capacitor array may be mismatch due to process variation(s), environmental temperature variation(s), which results in an error in the digital output and impacts on the linearity of the successive approximation register analog to digital converter. In traditional design, in order to solve this issue, a large capacitor is employed to reduce mismatches. However, using a large capacitor will significantly increase the overall circuit area. On the other hand, if an over sampling technique is utilized to reduce the error, the available frequency of the input signal will be limited.

SUMMARY OF THE INVENTION

In some aspects of the present disclosure, a successive approximation register analog to digital converter device includes a first digital to analog converter circuit, a second digital to analog converter circuit, a comparator circuit, a controller circuit, and a dynamic element matching circuit. The second digital to analog converter circuit is configured to cooperate with the first digital to analog converter circuit to sample an input signal. The comparator circuit is configured to generate a plurality of first comparison results according to an output of the first digital to analog converter circuit and an output of the second digital to analog converter circuit. The controller circuit is configured to generate a plurality of first bits and a plurality of second bits according to the plurality of first comparison results and store the plurality of first bits and a plurality of second bits, in which the plurality of second bits are for switching the second digital to analog converter circuit. The dynamic element matching circuit is configured to encode the plurality of first bits to generate a plurality of third bits, in order to fresh the first digital to analog converter circuit. After the first digital to analog converter circuit is refreshed, the controller circuit is further configured to reset partial bits in the plurality of second bits, the comparator circuit is further configured to generate a plurality of second comparison results according to the output of the first digital to analog converter circuit and the output of the second digital to analog circuit after the partial bits are reset, and the controller circuit is further configured to generate a plurality of fourth bits according to the plurality of second comparison results and generate a digital output according to the plurality of first bits, the plurality of second bits, and the plurality of fourth bits.

In some aspects of the present disclosure, a signal conversion method includes the following operations: sampling, by a cooperation between a first digital to analog converter circuit and a second digital to analog converter circuit, an input signal, in order to generate a plurality of first comparison results according to an output of the first digital to analog converter circuit and an output of the second digital to analog converter circuit; generating a plurality of first bits and a plurality of second bits according to the plurality of first comparison results and storing the plurality of first bits and a plurality of second bits, wherein the plurality of second bits are for switching the second digital to analog converter circuit; encoding the plurality of first bits to generate a plurality of third bits, in order to fresh the first digital to analog converter circuit; resetting partial bits in the plurality of second bits after the first digital to analog converter circuit is refreshed; generating a plurality of second comparison results according to the output of the first digital to analog converter circuit and the output of the second digital to analog circuit after the partial bits are reset; generating a plurality of fourth bits according to the plurality of second comparison results; and generating a digital output according to the plurality of first bits, the plurality of second bits, and the plurality of fourth bits.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
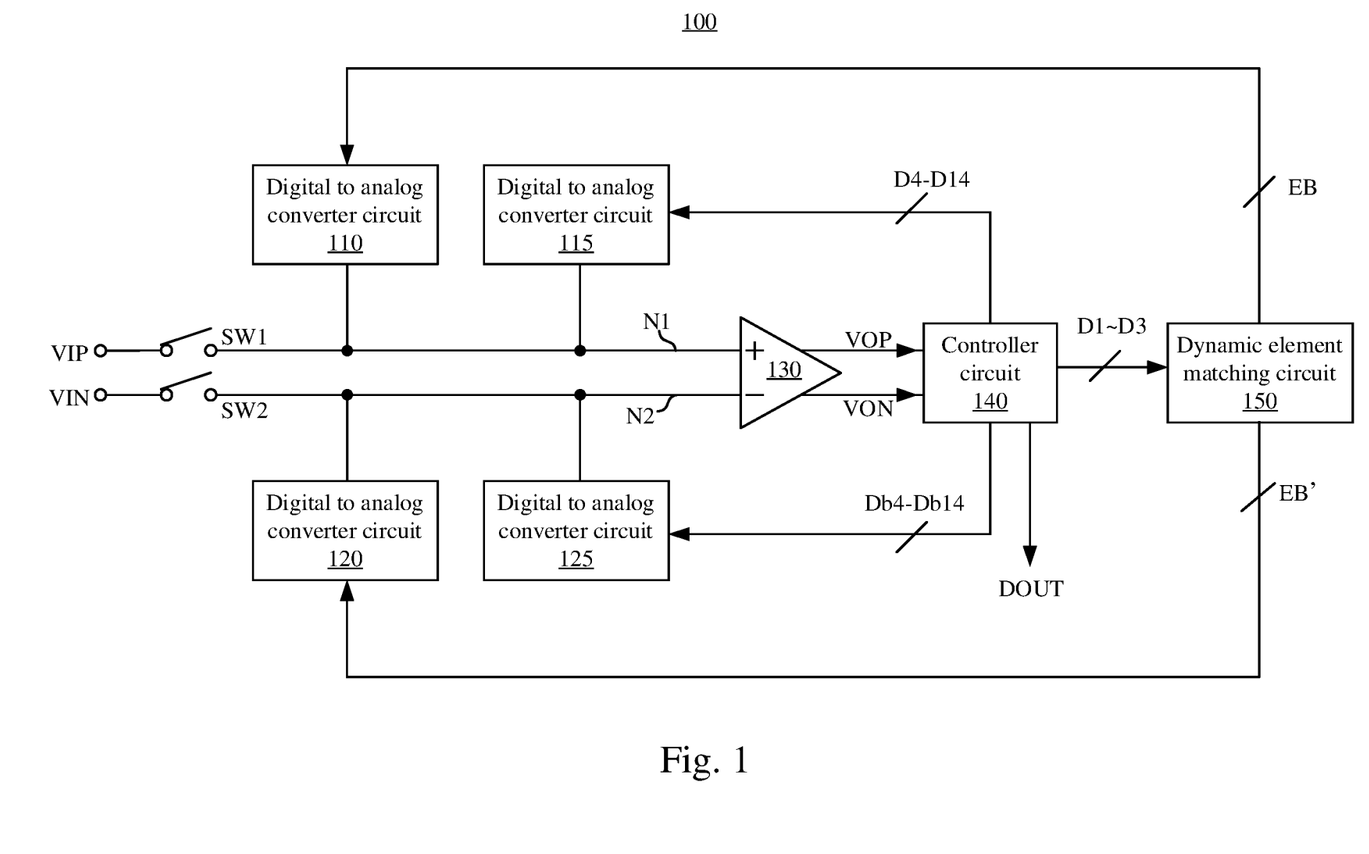
FIG. 1 shows a schematic diagram of a successive approximation register analog to digital converter device according to some embodiments of the present disclosure.

FIG. 1 shows a schematic diagram of a successive approximation register (SAR) analog to digital converter device 100 (hereinafter referred to as "SAR analog to digital converter device 100" for simplicity) according to some embodiments of the present disclosure. The SAR analog to digital converter device 100 may generate a digital output DOUT according to an input signal VIP and an input signal VIN.

The SAR analog to digital converter device 100 includes a switch SW1, a switch SW2, a digital to analog converter circuit 110, a digital to analog converter circuit 115, a digital to analog converter circuit 120, a digital to analog converter circuit 125, a comparator circuit 130, a controller circuit 140, and a dynamic element matching circuit 150.

The switch SW1 and the switch SW2 are turned on during a sampling phase. As a result, the input signal VIP and the input signal VIN are respectively transmitted to a node N1 and a node N2. Under this condition, the digital to analog converter circuit 110 may cooperate with the digital to analog converter circuit 115 to sample the input signal VIP, and the digital to analog converter circuit 120 may cooperate with the digital to analog converter circuit 125 to sample the input signal VIN.

The digital to analog converter circuit 110 and the digital to analog converter circuit 120 correspond to high weight bits (e.g., most significant bits) in the digital output DOUT, and the digital to analog converter circuit 115 and the digital to analog converter circuit 125 corresponds to low weight bits (e.g., least significant bits) in the digital output DOUT. In other words, the weight corresponding to the digital to analog converter circuit 110 is higher than the weight corresponding to the digital to analog converter circuit 115, and the weight corresponding to the digital to analog converter circuit 120 is higher than the weight corresponding to the digital to analog converter circuit 125. Arrangements about the digital to analog converter circuits 110, 115, 120, and 125 are described with reference to FIG. 2.

During an analog to digital conversion phase, the switch SW1 and the switch SW2 are not turned on. During this phase, the digital to analog converter circuit 110 may generate a corresponding output at the node N1 according to the high weight bits, and the digital to analog converter circuit 115 generates the corresponding output at the node N1 according to the low weight bits. In other words, the outputs of the digital to analog converter circuits 110 and 115 can be utilized to adjust the level of the node N1. Similarly, the digital to analog converter circuit 120 may generate a corresponding output at the node N2 and the digital to analog converter circuit 125 may generate a corresponding output at the node N2. In other words, the outputs of the digital to analog converter circuits 120 and 125 can be utilized to adjust the level of the node N2.

The comparator circuit 130 is configured to generate a decision signal VOP and a decision signal VON according to the outputs of the digital to analog converter circuits 110, 115, 120, and 125. For example, if the level of the node N1 is higher than that of the node N2, the decision signal VOP has a logic value of 1, and the decision signal VON has a logic value of 0, but the present disclosure is not limited thereto. Alternatively, if the level of the node N1 is lower than that of the node N2, the decision signal VOP has the logic value of 0, and the decision signal VON has the logic value of 1, but the present disclosure is not limited thereto. During the analog to digital conversion phase, the comparator circuit 130 may sequentially generate comparison results (i.e., multiple sets of the decision signal VOP and the decision signal VON). The controller circuit 140 may sequentially generate bits D1-D14 according to those comparison results, and store the bits D1-D14. In this example, the bits D1-D3 are most significant bits, and the bits D4-D14 are least significant bits which are utilized to switch the digital to analog converter circuit 115. In some embodiments, the controller circuit 140 further output bits Db4-Db14 to switch the digital to analog converter circuit 125, in which a corresponding one of the bits D4-D14 and a corresponding one of the bits Db4-Db14 have opposite logic values. For example, when the bit D4 has the logic value of 1, the bit Db4 has the logic value of 0. With this analogy, when the bit D14 has the logic value of 0, the bit Db14 has the logic value of 1.

In some embodiments, the controller circuit 140 may perform an SAR algorithm having redundancy calculation to generate the bits D1-D14, but the present disclosure is not limited thereto. In some embodiments, based on the arrangements of the digital to analog converter circuits 110, 115, 120, and 125, the SAR algorithm may be a binary search algorithm or a non-binary search algorithm.

The dynamic element matching circuit 150 is configured to encode the bits D1-D3 to generate bits EB, in order to refresh the digital to analog converter circuit 110. In some embodiments, the dynamic element matching circuit 150 is further configured to encode the bits D1-D3 to generate bits EB', in order to refresh the digital to analog converter circuit 120. In some embodiments, each of the controller circuit 140 and the dynamic element matching circuit 150 may be implemented with a digital signal processor circuit. In some embodiments, the controller circuit 140 and the dynamic element matching circuit 150 may be integrated into a digital control logic circuitry.

After the digital to analog converter circuits 110 and 120 are refreshed, the controller circuit 140 further resets certain bits in the bits D4-D14 and certain bits in the bits D4b-D14b, and the comparator circuit 130 further generates comparison results according to the outputs of the digital to analog converter circuits 110, 115, 120, and 125 after those certain bits are reset. The controller circuit 140 is further configured to generate bits according to those comparison result, and generate the digital output DOUT according to the bits D1-D14 and multiple bits (e.g., bits D10_F-D14_F as discussed below). Operations regarding herein will be given with reference to FIG. 3.

Figure 2:
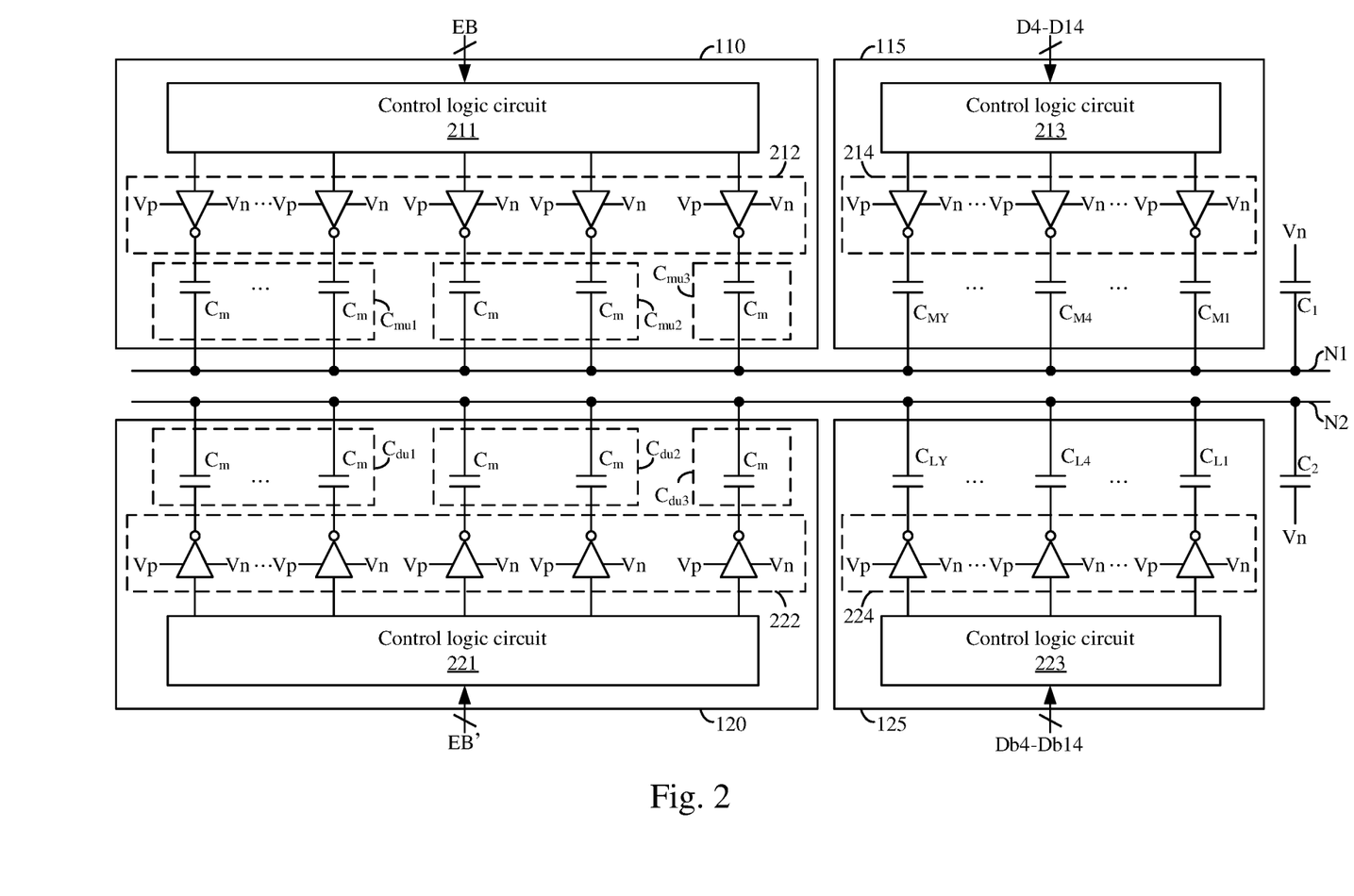
FIG. 2 shows a schematic diagram of the digital to analog converter circuits in FIG. 1 according to some embodiments of the present disclosure.

FIG. 2 shows a schematic diagram of the digital to analog converter circuits 110, 115, 120, and 125 in FIG. 1 according to some embodiments of the present disclosure. In this example, each of the digital to analog converter circuit 110, 115, 120, and 125 may be a capacitive digital to analog converter circuit.

The digital to analog converter circuit 110 includes a control logic circuit 211, a switching circuit 212, and capacitors $C_{mu1}$-$C_{mu3}$. The capacitors $C_{mu1}$-$C_{mu3}$ are arranged based on thermometer code. For example, the capacitor $C_{mu1}$ includes four unit capacitors $C_m$ (i.e., the weight corresponding to the capacitor $C_{mu1}$ is 4), the capacitor $C_{mu2}$ includes two unit capacitors $C_m$ (i.e., the weight corresponding to the capacitor $C_{mu2}$ is 2, and the capacitor $C_{mu3}$ include one unit capacitor $C_m$ (i.e., the weight corresponding to the capacitor $C_{mu3}$ is 1). In the digital to analog converter circuit 110, one terminals of the unit capacitors $C_m$ are coupled to the node N1, and other terminals of the unit capacitors $C_m$ are coupled to the switching circuit 212. The control logic circuit 211 controls the switching circuit 212 according to the bits EB. The switching circuit 212 transmits a reference voltage Vp or a reference voltage Vn to a corresponding unit capacitor $C_m$ based on the control of the control logic circuit 211.

Similarly, the digital to analog converter circuit 120 includes a control logic circuit 221, a switching circuit 222, and capacitor $C_{du1}$-$C_{du3}$. The capacitors $C_{du1}$-$C_{du3}$ are arranged based on thermometer code. For example, the capacitor $C_{du1}$ includes four unit capacitor $C_m$ (i.e., the weight corresponding to the capacitor $C_{du1}$ is 4), the capacitor $C_{du2}$ includes two unit capacitors $C_m$ (i.e., the weight corresponding to the capacitor $C_{du2}$ is 2), and the capacitor $C_{du3}$ includes one unit capacitor $C_m$ (i.e., the weight corresponding to the capacitor $C_{du3}$ is 1). In the digital to analog converter circuit 120, terminals of the unit capacitors $C_m$ are coupled to the node N2, and other terminals of the unit capacitors $C_m$ are coupled to the switching circuit 222. The control logic circuit 221 controls the switching circuit 222 according to the bits EB'. The switching circuit 222 transmits the reference voltage Vp or the reference voltage Vn to the corresponding unit capacitor $C_m$ based on the control of the control logic circuit 221.

The digital to analog converter circuit 115 includes a control logic circuit 213, a switching circuit 214 and capacitors $C_{M1}$-$C_{MY}$ (several capacitors thereof are not shown in the figure). Capacitance values of the capacitors $C_{M1}$-$C_{MY}$ are different from each other, in order to correspond to different weights. For example, in the capacitors $C_{M1}$-$C_{MY}$, the capacitor $C_{MY}$ corresponds to a highest weight and thus has a highest capacitance value, and the capacitor $C_{M1}$ corresponds to a lowest weight and thus has a lowest capacitance value. The control logic circuit 213 controls the switching circuit 214 according to the bits D4-D14. The switching circuit 214 transmits the reference voltage Vp or the reference voltage Vn to the capacitors $C_{M1}$-$C_{MY}$ based on the control of the control logic circuit 213.

Similarly, the digital to analog converter circuit 125 includes a control logic circuit 223, a switching circuit 224, and capacitors $C_{L1}$-$C_{LY}$ (serval of which are not shown in the figure). The capacitance values of the capacitor $C_{L1}$-$C_{LY}$ are different from each other to correspond to different weights. For example, in the capacitors $C_{L1}$-$C_{LY}$, the capacitor $C_{LY}$ corresponds to the highest weight and thus has a highest capacitance value, and the capacitor $C_{L1}$ corresponds to a lowest weight and thus has a lowest capacitance value. The control logic circuit 223 controls the switching circuit 224 according to the bits Db4-Db14. The switching circuit 224 transmits the reference voltage Vp or the reference voltage Vn to the capacitors $C_{L1}$-$C_{LY}$ based on the control of the control logic circuit 223.

In some embodiments, the SAR analog to digital converter device 100 in FIG. 1 further includes a capacitor C1 and a capacitor C2. The capacitor C1 is coupled to the node N1 and is configured to receive the reference voltage Vn. The capacitor C2 is coupled to the node N2 and is configured to receive the reference voltage Vn. In some embodiments, the capacitor C1 and the capacitor C2 are configured to attenuate the impacts from the reference voltage Vp and the reference voltage Vn on the node N1 and the node N2 when switching of capacitors. In other words, the capacitors C1 and C2 are configured to reduce the equivalent gain which is a ratio of the reference voltages Vp and Vn to inputs of the comparator circuit 130, and thus able to higher reference voltages Vp and Vn may be utilized with such arrangement. In some embodiments, the capacitor C1 and the capacitor C2 may be considered as parasitic capacitors coupled between the nodes N1-N2 and ground. In some embodiments, the capacitance value of the capacitor C1 may be the same as that of the capacitor $C_{M1}$, and the capacitance value of the capacitor C2 may be the same as that of the capacitor Cu.

FIG. 2 is given with examples using a binary digital to analog converter, but the present disclosure is not limited thereto. In some embodiments, capacitors in FIG. 2 may be implemented with non-binary code or segmented-coding. In some embodiments, the control logic circuit (e.g., the control logic circuit 211, 213, 221, or 223) and the switching circuit (e.g., the switching circuit 212, 214, 222, or 224) may be implemented with digital circuit(s) and/or switch circuit(s).

Figure 3:
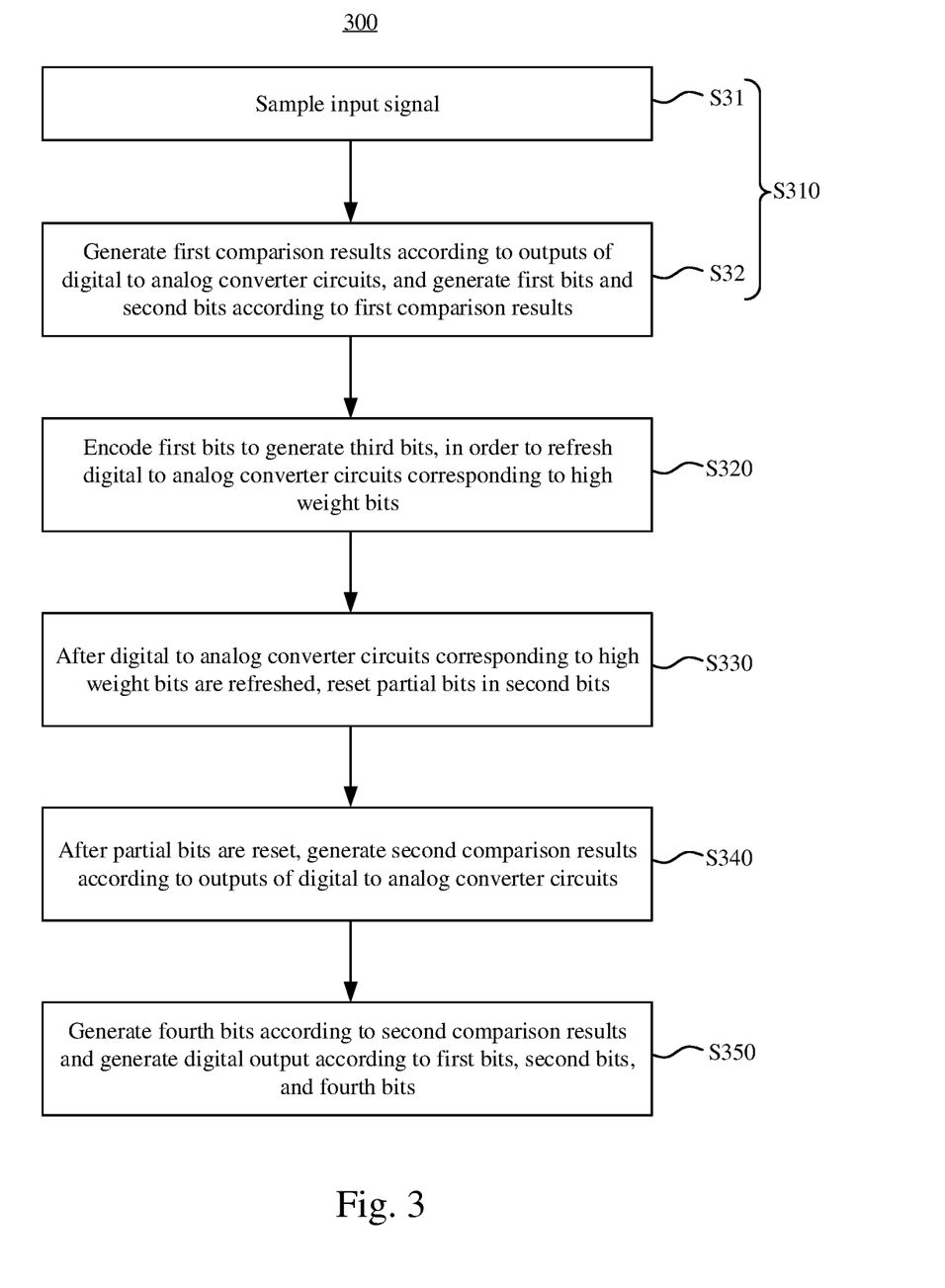
FIG. 3 shows a flow chart of a signal conversion method according to some embodiments of the present disclosure.

FIG. 3 shows a flow chart of a signal conversion method 300 according to some embodiments of the present disclosure. In some embodiments, the signal conversion method 300 may be performed by the SAR analog to digital converter device 100 in FIG. 1. For ease of understanding, relevant operations of the SAR analog to digital converter device 100 are described with the signal conversion method 300.

In operation S310, an initial SAR analog to digital conversion is performed to generate first bits (e.g., the bits D1-D3) and second bits (e.g., the bits D4-D14). Operation S310 includes step S31 and step S32.

In step S31, the input signal is sampled. For example, the switch SW1 and the switch SW2 are turned on, and all capacitors in the digital to analog converter circuit 110, 115, 120, and 125 receive the reference voltage Vp. Under this condition, the digital to analog converter circuit 110 may cooperate with the digital to analog converter circuit 115 to sample the input signal VIP, and the digital to analog converter circuit 120 may cooperate with the digital to analog converter circuit 125 to sample the input signal VIN. After the sampling is completed, the switch SW1 and the switch SW2 are not turned on, and all capacitors in the digital to analog converter circuit 110, 115, 120, and 125 continue receiving the reference voltage Vp. In step S32, first comparison results (which corresponds to sets of decision signals VOP and VON generated from the initial SAR analog to digital conversion) are generated according to outputs of digital to analog converter circuits, and first bits (e.g., the bits D1-D3) and second bits (e.g., the bits D4-D14) are generated according to those comparison results.

In operation S320, the first bits are encoded to generate third bits (e.g., the bits EB), in order to refresh digital to analog converter circuit(s) corresponding to high weight bits.

In some embodiments, the dynamic element matching circuit 150 may encode the bits D1-D3 to be bits corresponding to thermometer code, and perform a randomization (or pseudo-randomization) algorithm according to those bits to generate the bits EB, and generate the corresponding bits EB' according to the bits EB, in which the bits EB may be utilized to refresh the digital to analog converter circuit 110, and the bits EB' may be utilized to refresh the digital to analog converter circuit 120. In general, the definition of the bits EB' is determined based on the logic that the capacitors $C_m$ being controlled by the bits EB to receive the reference voltage Vn or the reference voltage Vp, but the present disclosure is not limited thereto. In some embodiments, the bits EB may be, but not limited to, logical complements of the bits EB'.

For example, if the bits D1-D3 are 100, the digital code of the bits D1-D3 is +1 (i.e., +4−2−1=+1), which corresponds to one unit capacitor $C_m$. It is assumed that, in the initial SAR analog to digital conversion, the digital to analog converter circuit 110 utilizes a first unit capacitor $C_m$ in the capacitor $C_{mu1}$ to generate the output corresponding to the above digital code. For example, the first unit capacitor $C_m$ receives the reference voltage Vn, and the remaining unit capacitors $C_m$ in the digital to analog converter circuit 110 and all unit capacitors $C_m$ in the digital to analog converter circuit 120 receive the reference voltage Vp, in order to generate the output corresponding to such digital code. After processed by the dynamic element matching circuit 150, the digital to analog converter circuit 110 may utilize another unit capacitor $C_m$ (e.g., the second unit capacitor $C_m$ in the capacitor $C_{mu1}$ to generate the output corresponding to the above digital code according to the bits EB. For example, the second unit capacitor $C_m$ receives the reference voltage Vn, and the remaining unit capacitors $C_m$ in the digital to analog converter circuit 110 and all unit capacitors $C_m$ in the digital to analog converter circuit 120 receive the reference voltage Vp, in order to generate the output corresponding to the above digital code.

In other words, in the initial SAR analog to digital conversion, the digital to analog converter circuit 110 may utilize at least one first capacitor (e.g., the first unit capacitor $C_m$) in the unit capacitors $C_m$ to generate an output corresponding to the first comparison results. With the dynamic element matching circuit 150, the digital to analog converter circuit 110 may utilize at least one second capacitor (e.g., the second unit capacitor $C_m$) in the unit capacitors $C_m$ to generate the output corresponding to the first comparison results according to the bits EB, in which the at least one first capacitor is not completely the same as the at least one second capacitor. Effectively, the digital to analog converter circuit 110 is refreshed in response to the bits EB, in order to select different unit capacitor $C_m$ to generate the same output. As a result, the impacts from mismatches among the unit capacitors $C_m$ can be reduced, in order to improve the linearity of the digital to analog converter circuit 110.

In operation S330, after the digital to analog circuits corresponding to the high weight bits are refreshed, partial bits in the second bits are reset. In operation S340, after the partial bits are reset, second comparison results are generated according to the outputs of the digital to analog converter circuits. In operation S350, fourth bits are generated according to the second comparison results, and a digital output is generated according to the first bits, the second bits, and the fourth bits.

For example, after the digital to analog converter circuit 110 is refreshed, the controller circuit 140 may reset partial bits in the bits D4-D14 and keep remaining bits in the bits D4-D14 and the bits D1-D3 being unchanged. In some embodiments, weights corresponding to the remaining bits are higher than the weights corresponding to the partial bits. For example, the partial bits may be the bits D10-D14 that correspond to lower weights in the bits D4-D14, and the remaining bits may be bits D4-D9 that correspond to higher weights in the bits D4-D14. It should be understood that, as the remaining bits D4-D9 are kept unchanged, and the corresponding bits Db4-Db9 in the bits Db4-Db14 are kept unchanged as well. The digital to analog converter circuits 110, 115, 120, and 125 may be switched in response to those bits, in order to generate corresponding outputs. Accordingly, after the bits D10-D14 (and the bits Db10-Db14) are reset, the comparator circuit 130 may generate second comparison results (i.e., sets of the decision signals VOP and VON) according to the outputs of the digital to analog converter circuit 110, 115, 120, and 125. The controller circuit 140 may generate the fourth bits (i.e., bits D10_F-D14_F as discussed below) according to those second comparison results, and generate the digital output DOUT according to the bits D1-D3, the bits D4-D14, and those fourth bits.

In an example, the SAR analog to digital converter device 100 is a 12-bit SAR analog to digital converter, and two redundancy bits are generated after the most significant bits (e.g., bits D1-D3) are generated. As a result, in the analog to digital conversion, the SAR analog to digital converter device 100 may generate 14 bits (e.g., the bits D1-D14). Under this condition, with the above operations, the bits generated from the controller circuit 140 may be listed as follows:

| Corresponding comparison results | Stored bits |
| --- | --- |
| First comparison results | D1, D2, D3, . . . , D9, D10, D11, . . . , D14 |
| Second comparison results | D1, D2, D3, . . . , D9, D10_F, D11_F, . . . , D14_F |

The first comparison results are generated in the initial SAR analog to digital conversion, and the second comparison results are generated after the digital to analog converter circuit 110 is rest. With the above operations, the controller circuit 140 may obtain the sets of bits (e.g., the first set of bits D1-D14 and the second set of bits D10_F-D14_F). As a result, the controller circuit 140 may perform a statistical calculation according to those sets of bits, in order to generate the digital output DOUT.

For example, the controller circuit 140 may average the partial bits (e.g., the bits D10-D14) and the fourth bits (e.g., the bits D10_F-D14_F) to generate fifth bits (e.g., an average result of the bits D10-D14 and D10_F-D14_F), and combine the bits D1-D3, the remaining bits D4-D10, and those fifth bits to be the digital output DOUT. Alternatively, the controller circuit 140 may directly average those sets of bits in the above table to generate the digital output DOUT. With the dynamic element matching circuit 150 and the above statistical calculation, it is able to reduce the impacts from component (e.g., capacitor(s)) mismatches. As a result, the linearity of the SAR analog to digital converter device 100 can be improved without increasing the area of the component(s). In some embodiments, the statistical calculation may be an averaging calculation or a weighted-averaging calculation, butt the present disclosure is not limited thereto. Moreover, as the above operations do not employ over-sampling, the frequency of the input signal VIN is not limited by the sampling frequency, and thus the available frequency of the input signal VIN will not be affected.

The above description of the signal conversion method 300 includes exemplary operations, but the operations of the signal conversion method 300 are not necessarily performed in the order described above. Operations of the signal conversion method 300 can be added, replaced, changed order, and/or eliminated, or the operations of the signal conversion method 300 can be executed simultaneously or partially simultaneously as appropriate, in accordance with the spirit and scope of various embodiments of the present disclosure.

The above descriptions are given for illustrative purposes, and the present disclosure is not limited thereto. For example, in other embodiments, operations S320, S330, and S340 may be performed repeatedly to obtain more sets of bits (e.g., more sets of the bits D10_F-D14_F), in order to generate a more accurate digital output DOUT. For example, after the second set of bits in the above table is obtained, the dynamic element matching circuit 150 may encode the bits D1-D3 again to generate the bits EB and EB', in order to refresh the digital to analog converter circuits 110 and 120. Afterwards, the controller circuit 140 may reset the bits D10_F-D14_F and Db10-Db14. After the bits D10-D14 (and the bits Db10-Db14) are reset, the comparator circuit 130 may repeatedly compare the output of the digital to analog converter circuit 110 (and the digital to analog converter circuit 115 with the output of the digital to analog converter circuit 120 (and the digital to analog converter circuit 125) to generate more second comparison results. The controller circuit 140 may generate bits (e.g., bits D10_F1-D14_F1) according to those second comparison results, and store those bits as a third set of bits (e.g., the bits D1-D9 and D10_F1-D14_F1). As a result, the controller circuit 140 may generate the digital output DOUT according to the first, the second, and the third sets of bits. For example, the controller circuit 140 may average those sets of bits to generate the digital output DOUT. In some embodiments, if the number of comparisons and/or the number of the sets of bits are higher, the digital output DOUT is more accurate.

Moreover, the above embodiments are described with examples using a differential arrangement, but the present disclosure is not limited thereto. In some embodiments, the above embodiments may be implemented with a single ended arrangement. In some embodiments, in the single ended arrangement, the SAR analog to digital converter device 100 may employ certain digital to analog converter circuits in the digital to analog converter circuit 110, 115, 120 and 125 that are coupled to an input terminal of the comparator circuit 130 (e.g., the node N1 or the node N2). For example, the SAR analog to digital converter device 100 may be a VCM-based single-ended device, which may only employ the digital to analog converter circuit 110 and 115.

As described above, the SAR analog to digital converter device and the signal conversion method in some embodiments of the present disclosure may employ the dynamic element matching technique to refresh the digital to analog converter circuit corresponding to high weights, and utilize a statistical calculation to generate final digital output. As a result, the impacts of component mismatch can be reduced, in order to improve the linearity without increasing component area. In addition, the above relevant operations do not involve the oversampling technique, and thus the available frequency of the input signal is not limited.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A successive approximation register analog to digital converter device, comprising:
    a first digital to analog converter circuit;
    a second digital to analog converter circuit configured to cooperate with the first digital to analog converter circuit to sample an input signal;
    a comparator circuit configured to generate a plurality of first comparison results according to an output of the first digital to analog converter circuit and an output of the second digital to analog converter circuit;
    a controller circuit configured to generate a plurality of first bits and a plurality of second bits according to the plurality of first comparison results and store the plurality of first bits and a plurality of second bits, wherein the plurality of second bits are for switching the second digital to analog converter circuit; and
    a dynamic element matching circuit configured to encode the plurality of first bits to generate a plurality of third bits, in order to fresh the first digital to analog converter circuit,
    wherein after the first digital to analog converter circuit is refreshed, the controller circuit is further configured to reset partial bits in the plurality of second bits, the comparator circuit is further configured to generate a plurality of second comparison results according to the output of the first digital to analog converter circuit and the output of the second digital to analog circuit after the partial bits are reset, and the controller circuit is further configured to generate a plurality of fourth bits according to the plurality of second comparison results and generate a digital output according to the plurality of first bits, the plurality of second bits, and the plurality of fourth bits.

2. The successive approximation register analog to digital converter device of claim 1, wherein the plurality of first bits are a plurality of most significant bits, and the plurality of second bits are a plurality of least significant bits.

3. The successive approximation register analog to digital converter device of claim 1, wherein the first digital to analog converter circuit is further configured to be refreshed repeatedly to reset the partial bits, and the comparator circuit is further configured to repeatedly compare the output of the first digital to analog converter circuit with the output of the second digital to analog converter circuit after the partial bits are reset, in order to generate the plurality of second comparison results.

4. The successive approximation register analog to digital converter device of claim 1, wherein a weight corresponding to the first digital to analog converter circuit is higher than a weight corresponding to the second digital to analog converter circuit.

5. The successive approximation register analog to digital converter device of claim 1, wherein the controller circuit is configured to perform a statistical calculation according to the partial bits and the plurality of fourth bits to generate a plurality of fifth bits, and combine the plurality of first bits, remaining bits in the plurality of second bits, and the plurality of fifth bits to form the digital output.

6. The successive approximation register analog to digital converter device of claim 5, wherein weights corresponding to the remaining bits are higher than weights corresponding to the partial bits.

7. The successive approximation register analog to digital converter device of claim 5, wherein the controller circuit is configured to average the partial bits and the plurality of fourth bits to generate the plurality of fifth bits.

8. The successive approximation register analog to digital converter device of claim 1, wherein the dynamic element matching circuit is configured to encode the plurality of first bits to be a thermometer code and generate the plurality of third bits according to the thermometer code.

9. The successive approximation register analog to digital converter device of claim 1, wherein the first digital to analog converter circuit is configured to generate an output corresponding to the plurality of the first comparison results according to the plurality of third bits.

10. The successive approximation register analog to digital converter device of claim 9, wherein the first digital to analog converter circuit is configured to utilize at least one first capacitor to generate the output corresponding to the plurality of the first comparison results, and utilize at least one second capacitor to generate the output corresponding to the plurality of first comparison results according to the plurality of third bits, and the at least one first capacitor is not completely the same as the at least one second capacitor.

11. A signal conversion method, comprising:
sampling, by a cooperation between a first digital to analog converter circuit and a second digital to analog converter circuit, an input signal, in order to generate a plurality of first comparison results according to an output of the first digital to analog converter circuit and an output of the second digital to analog converter circuit;
generating a plurality of first bits and a plurality of second bits according to the plurality of first comparison results and storing the plurality of first bits and a plurality of second bits, wherein the plurality of second bits are for switching the second digital to analog converter circuit;
encoding the plurality of first bits to generate a plurality of third bits, in order to fresh the first digital to analog converter circuit;
resetting partial bits in the plurality of second bits after the first digital to analog converter circuit is refreshed;
generating a plurality of second comparison results according to the output of the first digital to analog converter circuit and the output of the second digital to analog circuit after the partial bits are reset;
generating a plurality of fourth bits according to the plurality of second comparison results; and
generating a digital output according to the plurality of first bits, the plurality of second bits, and the plurality of fourth bits.

12. The signal conversion method of claim 11, wherein the plurality of first bits are a plurality of most significant bits, and the plurality of second bits are a plurality of least significant bits.

13. The signal conversion method of claim 11, wherein the first digital to analog converter circuit is further configured to be refreshed repeatedly to reset the partial bits, and generating the plurality of second comparison results according to the output of the first digital to analog converter circuit and the output of the second digital to analog circuit after the partial bits are reset comprises:
repeatedly comparing the output of the first digital to analog converter circuit with the output of the second digital to analog converter circuit after the partial bits are reset, in order to generate the plurality of second comparison results.

14. The signal conversion method of claim 11, wherein a weight corresponding to the first digital to analog converter circuit is higher than a weight corresponding to the second digital to analog converter circuit.

15. The signal conversion method of claim 11, wherein generating the digital output according to the plurality of first bits, the plurality of second bits, and the fourth bits comprises:
performing a statistical calculation according to the partial bits and the plurality of fourth bits to generate a plurality of fifth bits; and
combining the plurality of first bits, remaining bits in the plurality of second bits, and the plurality of fifth bits to be the digital output.

16. The signal conversion method of claim 15, wherein weights corresponding to the remaining bits are higher than weights corresponding to the partial bits.

17. The signal conversion method of claim 15, wherein the statistical calculation is an averaging calculation.

18. The signal conversion method of claim 11, wherein encoding the plurality of first bits to generate the plurality of third bits, in order to fresh the first digital to analog converter circuit comprises:
encoding, by a dynamic element matching circuit, the plurality of first bits to be a thermometer code; and
generating the plurality of third bits according to the thermometer code.

19. The signal conversion method of claim 11, wherein the first digital to analog converter circuit is configured to generate an output corresponding to the plurality of the first comparison results according to the plurality of third bits.

20. The signal conversion method of claim 19, wherein the first digital to analog converter circuit is configured to utilize at least one first capacitor to generate the output corresponding to the plurality of the first comparison results, and utilize at least one second capacitor to generate the output corresponding to the plurality of first comparison results according to the plurality of third bits, and the at least one first capacitor is not completely the same as the at least one second capacitor.

* * * * *